United States Patent [19]

Sato et al.

[11] Patent Number: 4,882,455
[45] Date of Patent: Nov. 21, 1989

[54] ELECTRONIC CIRCUIT SUBSTRATES

[75] Inventors: Yasuyuki Sato, Iwai; Shinji Saito, Hashima; Hidetoshi Yamauchi, Anpachi, all of Japan

[73] Assignee: Ibiden Co., Ltd., Japan

[21] Appl. No.: 229,733

[22] Filed: Aug. 2, 1988

Related U.S. Application Data

[63] Continuation of Ser. No. 106,903, Oct. 9, 1987, abandoned, which is a continuation of Ser. No. 841,825, Mar. 20, 1986, abandoned.

[30] Foreign Application Priority Data

Mar. 27, 1985 [JP] Japan .................................. 60-64598
Jul. 26, 1985 [JP] Japan ................................. 60-166185

[51] Int. Cl.⁴ ........................................... H05K 01/03
[52] U.S. Cl. .................................. 174/68.5; 428/209; 428/315.5; 428/307.3
[58] Field of Search ............ 174/68.5; 428/209, 305.5, 428/307.3, 312.6, 315.5, 315.7, 319.3, 320.2

[56] References Cited

U.S. PATENT DOCUMENTS

| | | | |
|---|---|---|---|
| 2,421,652 | 6/1947 | Robinson | 174/110 A X |
| 2,778,762 | 1/1957 | Eisler | 428/325 |
| 3,202,591 | 8/1965 | Curran | 174/68.5 X |
| 3,325,303 | 6/1967 | Lant et al. | 428/325 |
| 3,791,863 | 2/1974 | Quirk | 428/209 X |
| 3,817,781 | 6/1974 | Church et al. | 428/325 X |
| 3,825,468 | 7/1974 | Wojcik et al. | 428/312.6 X |
| 3,838,204 | 9/1974 | Ahn et al. | 174/68.5 |
| 3,900,940 | 8/1975 | Gebhard | 419/27 |
| 4,047,290 | 9/1977 | Weitze et al. | 174/68.5 X |
| 4,353,957 | 10/1982 | Rutt et al. | 174/68.5 X |
| 4,412,377 | 11/1983 | Nagashima et al. | 427/126.4 X |
| 4,483,751 | 11/1984 | Murayama et al. | 174/68.5 X |
| 4,528,212 | 7/1985 | Cairns et al. | 427/376.2 X |
| 4,540,621 | 9/1985 | Eggerding et al. | 428/209 |
| 4,620,264 | 10/1986 | Ushifusa et al. | 428/209 X R |
| 4,689,262 | 8/1987 | Bloom | 428/209 X |

FOREIGN PATENT DOCUMENTS 2748271  5/1979  Fed. Rep. of Germany ..... 174/68.5

OTHER PUBLICATIONS

Wu et al., Anodized Aluminum Substrate of Composite Type ..., Conf. Proc. of 31st Electronic Components IEEE, May 1981, pp. 145 to 48 relied on Insulation/Circuits, Aug. 1970, p. 17, relied on copy in 174/68.5.

E. A. Corl, Hydrophonic Seal for Damaged PC Board Laminate, IBM Tech. Disc. Bull., vol. 23, #12, May 1981, p. 5479, relied on.

Abolafia et al., Use of Polyimdied To Obtain a Smooth Surface, IBM Tech. Disc. Bull., vol. 20, #8, p. 3020, relied on copy in 174/68.5.

Primary Examiner—R. R. Kucia
Attorney, Agent, or Firm—Arnold, White & Durkee

[57] ABSTRACT

An electronic circuit substrate having excellent machinability and dimensional accuracy is disclosed, which comprises a porous ceramic sintered body having a three-dimensional network structure and contains permeable pores, and a resin filled into the permeable pores.

15 Claims, 1 Drawing Sheet

FIG_1
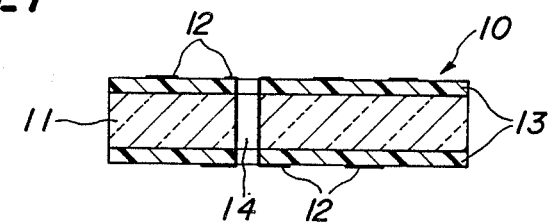
FIG_2
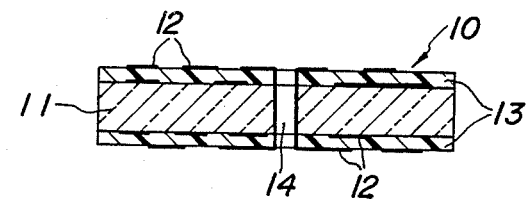
FIG_3
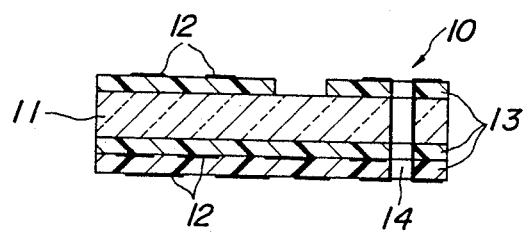
FIG_4
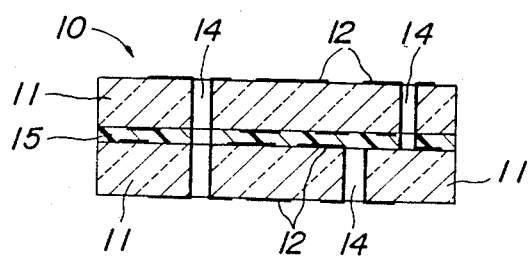

ns in the thermal conductivity and swells in the presence of humidity. Since the electronic component is generally required to be fixed to the substrate and connected to the wiring on the substrate, if the swelling of the substrate is caused in use, the electronic component may peel off from the substrate or the connection may be broken;

ELECTRONIC CIRCUIT SUBSTRATES

This is a continuation of application Ser. No. 106,903 filed Oct. 9, 1987, which in turn is a continuation of Ser. No. 841,825 filed Mar. 20, 1986, now both abandoned.

BACKGROUND OF THE INVENTION

1. Field of the Invention

This invention relates to an electronic circuit substrate suitable for the reduction of weight and the high integration, and more particularly to an electronic circuit substrate having excellent machinability and dimensional accuracy.

2. Related Art Statement

Lately, there have been known and practised various electronic circuit substrates, each of which has been made, for example, from glass/epoxy resin composite, alumina sintered body, mullite sintered body or the like. Further, as a process for the promotion of high integration, it is attempted to directly mount silicon integrated circuits and the like onto the substrate.

However, the glass/epoxy resin composite is largely different from the silicon integrated circuit in the thermal expansion coefficient. Therefore, only the silicon integrated circuit having a very small size can directly be mounted on the substrate made of the glass/epoxy resin composite. Further, the substrate of the glass/epoxy resin composite is liable to change its size at a circuit formation step, so that it is particularly difficult to apply this substrate to the formation of fine and precise circuits.

On the other hand, the densely sintered body of each of alumina, mullite and the like usually used is high in the hardness and considerably poor in the machinability. Therefore, if it is required to conduct the machining for the formation of through-holes or the like, it is attempted to perform the firing after the machining is conducted at a stage of green shaped body. In this case, however, it is difficult to make the shrinkage uniform at the firing, and also it is very difficult to fabricate substrates particularly requiring a high dimensional accuracy or a large size from these sintered bodies.

The drawbacks of the conventional electronic circuit substrates based on the above facts are mentioned below together with recently required conditions.

(1) The conventionally used sintered bodies such as alumina sintered body, mullite sintered body and the like are employed at the dense state, so that it is very difficult to form through-holes by machining after the sintering because the high hardness inherent to the sintered body is inversely injurious to the machining;

(2) In the densely sintered bodies such as alumina sintered body, mullite sintered body and the like, the drawback of the above item (1) is solved by subjecting to the machining at a state of a green shaped body. In this case, however, it is necessary to conduct the machining by previously considering the dimensional change due to the sintering shrinkage, which can not sufficiently move against the case of requiring a large size substrate;

(3) The alumina densely sintered body has a relatively large specific gravity and is unsuitable as an electronic circuit substrate for components desiring weight-saving as in video camera or the like;

(4) Different from the above densely sintered body, the glass/epoxy resin composite for the electronic circuit substrate is able to move against problems on machinability, large-scaling and weight reduction. In the glass/epoxy resin composite, however, there are fatal problems that it is poor in the thermal conductivity and swells in the presence of humidity. Since the electronic component is generally required to be fixed to the substrate and connected to the wiring on the substrate, if the swelling of the substrate is caused in use, the electronic component may peel off from the substrate or the connection may be broken;

(5) In the electronic circuit substrate formed by printing a resistor onto the substrate, the resistor swells together with the swelling of the substrate, so that the resistivity value may largely shift from the predetermined value;

(6) In the electronic circuit substrate, it is better to reduce dielectric loss in order to obtain good responsibility to electrical signal of each electronic component. Particularly, it is ideal that the dielectric loss is made zero as far as possible; and (7) There is no substrate solving all of the above facts.

SUMMARY OF THE INVENTION

With the foregoings is mind, the invention is to solve the aforementioned drawbacks of the material constituting the electronic circuit substrate.

It is another object of the invention to provide an electronic circuit substrate suitable for weight reduction and high integration which is easy in the machining and excellent in the dimensional accuracy.

It is a further object of the invention to provide an electronic circuit substrate having a good machinability and an excellent dimensional accuracy as well as other properties freely selected from properties required in this type of the substrate such as small dielectric loss, high strength, thermal expansion coefficient approximately equal to that of an integrated circuit in case of chip on board type for directly mounting the chip onto the substrate, excellent thermal conductivity for well dissipating heat generated from the integrated circuit, and so on.

According to the invention, there is the provision of an electronic circuit substrate comprising a porous ceramic sintered body having a crystal structure of three-dimensional network and containing permeable pores therein, and a resin filled in the permeable pores.

BRIEF DESCRIPTION OF THE DRAWINGS

The invention will be described with reference to the accompanying drawings, wherein:

FIGS. 1 to 4 are enlarged longitudinal sections of various embodiments of the electronic circuit substrate according to the invention, respectively.

DESCRIPTION OF THE PREFERRED EMBODIMENTS

In the electronic circuit substrate according to the invention, it is necessary that the permeable pores in the porous ceramic sintered body having a crystal structure of three-dimensional network are filled with a resin. Because the alumina sintered body usually used as the electronic circuit substrate is high in the hardness and very poor in the machinability owing to the densely sintered body, while the porous sintered body according to the invention is considerably excellent in the machinability after the sintering. Further, the thermal conductivity and hardness inherent to the ceramics are not so injured because the crystal of the ceramic sintered body has a three-dimensional network structure, while air impermeability indispensable to the electronic circuit board can be provided by filling the resin in the permeable pores of the ceramic sintered body.

According to the invention, it is preferable that the porous ceramic sintered body constituting the electronic circuit substrate mainly comprises at least one of $Al_2P_3$, $SiO_2$, ZnO, $ZrO_2$, MgO, PbO, $B_2O_3$, $Si_3N_4$, BN, AlN and compounds thereof. Although all of these materials have an electrically insulating property, if it is intended to use the porous ceramic sintered body without the formation of through-holes or the direct formation of conductor circuits onto the surface of the ceramic sintered body, a substance having semi-conductive properties such as SiC, $B_4C$ or the like may also be used.

Further, it is essential that the porous ceramic sintered body is composed of crystal grains having an average grain size of not more than 10 $\mu$m, which are bonded to each other at a three-dimensional network state. Thus, the porous ceramic sintered body is very good in the machinability, particularly the drilling property, and can be subjected to a precise working. Therefore, a ceramic composite body obtained by filling the permeable pores of the porous ceramic sintered body with a resin is suitable for use in an electronic circuit substrate provided with through-holes and the like, and in this case through-holes can easily be formed in place owing to the excellent drilling property.

In the porous ceramic sintered body according to the invention, the permeable porosity is preferable to be within a range of 10-70 volume %, because when the porosity is less than 10 volume %, the machinability is considerably degraded, while when it exceeds 70 volume %, the strength of the porous sintered body is substantially lost and consequently the breaking is apt to be caused in the handling and also it is difficult to develop the properties inherent to the ceramics.

When the electronic circuit substrate is made by using the above mentioned porous ceramic sintered body, if various properties such as thermal expansibility suitable for the direct mounting of integrated circuits, high thermal conductivity, small dielectric loss and the like are required in addition to the good machinability and dimensional accuracy, it is preferable to satisfy the following conditions. That is, when the electronic circuit substrate is required to have, for example, a thermal expansibility for directly mounting silicon integrated circuits on the substrate, it is advantageous that the crystal texture in the porous ceramic sintered body according to the invention is at least one of sillimanite, andalusite, kyanite, cordierite, and mullite. Because, when the porous sintered body has such a crystal texture, its thermal expansion coefficient can easily be approached to that of the silicon integrated circuit. Moreover, the electronic circuit substrate having a thermal expansion coefficient required for electronic circuits may be provided by properly mixing high thermal expansion coefficient material and low thermal expansion coefficient material instead of the aforementioned crystal texture.

On the other hand, when high strength and thermal conductivity are required in the electronic circuit substrate according to the invention in addition to the good machinability and dimensional accuracy, the material constituting the porous sintered body is advantageous to mainly contain at least one of alumina, aluminum nitride, boron nitride and compounds thereof.

Moreover, when the small dielectric loss is required in addition to the good machinability and dimensional accuracy, the material for the electronic circuit substrate according to the invention is advantageous to mainly contain at least one of steatite, forsterite, cordierite and alumina.

As a resin to be filled in the permeable pores of the porous ceramic sintered body, use may preferably be made of at least one resin selected from epoxy resin, polyimide resin, triazine resin, polyparabonic acid resin, polyamide imide resin, silicone resin, epoxy silicone resin, acrylic resin, methacrylic resin, aniline resin, phenolic resin, urethane resin, furan resin and fluorine resin.

After the resin is filled in the permeable pores of the porous ceramic sintered body, the porosity is preferable to be not more than 10 volume %, more particularly not more than 5 volume %. When the porosity exceeds 10 volume %, it is difficult to give the air impermeability inevitable as the electronic circuit substrate.

When the high strength is particularly required in the electronic circuit substrate according to the invention, it is favorable that an inorganic fiber cloth impregnated with a resin is laminated on at least one surface of the substrate, or a mixture of inorganic fiber and resin is applied to at least one surface of the substrate. In this case, the resin is advantageously the same as used in the filling of the permeable pores in the porous sintered body. As the inorganic fiber, use may advantageously be made of glass fiber, asbestos fiber, ceramic fiber and the like.

The formation of the electronic circuit substrate according to the invention will be described below.

The electronic circuit substrate according to the invention can be formed by shaping a starting material composed mainly of fine ceramic powder into a green shaped body through a molding process such as pressure molding, doctor blade molding or the like. When the green shaped body has a composition producing a liquid phase at the firing, it is fired at such a temperature region that the amount of liquid phase produced is not more than 5% by weight, while when the green shaped body has a composition causing vaporization phenomenon at the firing, it is fired by controlling the vaporization amount to not more than 5% by weight, whereby a porous ceramic sintered body is obtained. Thereafter, the resin is filled in the permeable pores of the porous sintered body.

When the ceramic material is shaped, for example, into a plate-like green shaped body and bonded without clogging the pores existent in the green shaped body, there may be employed various processes, such as a process of self-bonding ceramic powders through low-pressure or high-pressure sintering, a process wherein ceramic powders are bonded by reaction sintering with a substance producing ceramics through reaction, a process wherein ceramic powders are bonded with a binder such as glass cement or the like through low-pressure or high-pressure sintering, and so on.

In order to fill the resin in the permeable pores of the porous sintered body, there may be employed a process wherein the resin is melted by heating and then impregnated into the permeable pores, a process wherein the resin is impregnated into the permeable pores at a monomer state and converted into a polymer, a process wherein granulates of the resin are dispersed in a dispersion medium, impregnated into the permeable pores, dried and then baked at a melting temperature of the resin.

When the resin impregnated inorganic fiber cloth is laminated onto the ceramic composite body according to the invention, it is advantageous to press a laminate of the resin filled porous sintered body and the resin impregnated inorganic fiber cloth under heating.

In order to apply a mixture of resin and inorganic fiber to the ceramic composite body, there may be employed a spraying process, a brushing process and the like, whereby the mixture layer can strongly be bonded to the ceramic composite body.

As the starting material for the production of the porous ceramic sintered body, it is advantageous to use fine ceramic powder having an average grain size of not more than 10 μm for the provision of the porous sintered body having a high strength and a good machinability. Because, when the average grain size exceeds μm, the bonding position between grains becomes smaller and consequently it is difficult to produce a high strength porous sintered body.

When conductor circuits are formed on the electronic circuit substrate according to the invention, there may be employed various processes usually used in the formation of printed wiring boards or hybrid IC boards. For instance, there are a plating process, a process of adhering a metal foil, a process of using a resin conductor paste, an evaporation process, a process of using a thick-film conductor paste, a multi-wire process and a combination thereof. In the plating, there are adopted a tenting method, a panel pattern mixing method, a full additive method, a semi additive method and the like.

Moreover, after the conductor circuits are formed on the surface of the electronic circuit substrate according to the invention, multi-layer wiring board having multi-layers of conductor circuits may be fabricated very easily by adhering a prepreg layer consisting of a composite of long fiber and resin to the surface of the conductor circuit and further forming conductor circuits onto the surface of the prepreg layer.

The following examples are given in the illustration of the invention and are not intended as limitations thereof.

EXAMPLE 1

In this example, three kinds of minerals as shown in the following Table 1 were used to produce composite bodies as shown in the following Table 3, respectively.

TABLE 1

| | Mineral | Average grain size (μm) | Chemical composition (wt %) | | | | Firing temperature (°C.) |
|---|---|---|---|---|---|---|---|
| | | | $Al_2O_3$ | $SiO_2$ | CaO | MgO | |
| Example 1-1 | sillimanite | 3.7 | 55.2 | 41.2 | 0.4 | 1.7 | 1,100 |
| Example 1-2 | kyanite | 2.9 | 51.7 | 40.0 | 0.2 | 1.1 | 1,150 |
| Example 1-3 | mullite | 1.0 | 57.8 | 39.1 | 0.5 | 2.1 | 1,300 |

For conveniences' sake, the case of Example 1-1 in Tables 1 and 3 will be described below.

To 100 parts by weight of sillimanite powder having an average grain size of 3.7 μm and a chemical composition shown in Table 1 were added 2 parts by weight of polyvinyl alcohol, 1 part by weight of polyethylene glycol, 0.5 part by weight of stearic acid and 100 parts by weight of water, and then the resulting mixture was mixed in a ball mill for 3 hours and spray dried.

The thus dried mixture was weighed at a proper amount and molded in a metal die under a pressure of 1.5 t/cm$^2$ to obtain a green shaped body having a diameter of 40 mm, a thickness of 1 mm and a density of 1.99 g/cm$^3$ (51 volume %).

The green shaped body was placed in an alumina crucible and sintered at a temperature of 1,100° C. in air under an atmospheric pressure for 1 hour. The thus obtained sintered body had a density of 2.00 g/cm$^3$, a permeable porosity of 37 volume % and an average bending strength of 1.5 kg/mm$^2$.

Then, the sintered body was impregnated with a two-component type epoxy resin under vacuum and then subjected to a hardening treatment at a temperature of about 150° C. to obtain a composite body. The content of epoxy resin filled in the composite body was 19.4% by weight, and the ratio of epoxy resin occupied in the pores of the sintered body was approximately 94.1 volume %.

When through-holes of 0.8 mm in diameter are formed in the composite body by means of a super-hard drill (WC-Co), the formation of not less than 2,000 holes can rapidly be attained without breaking and cracking through the same drill, which shows that the composite body is excellent in the machinability.

This composite body had a thermal expansion coefficient (0°–150° C.) of $4.0\times10^{-6}$/°C., wich is approximate to that of silicon integrated circuit, and a specific resistance of not less than $10^{14}$ Ω.cm and a dielectric constant (1 MHz) of 6.2, which exhibited excellent properties as the electronic circuit substrate.

In brief, according to the electronic circuit substrate of this embodiment, the machinability in the formation of through-holes after the sintering is excellent, while the sintering shrinkage is small and also the thermal expansion coefficient in the final product is small, from which it is apparent that the dimensional accuracy is excellent. Further, in the electronic circuit substrate made from sillimanite (or other minerals), the thermal expansion coefficient is approximate to that of silicon integrated circuit, so that it is particularly suitable as a chip on board type substrate.

EXAMPLE 2

In this example, four kinds of alumina powders as shown in the following Table 2 were used to produce composite bodies as shown in the following Table 3, respectively.

TABLE 2

| | Average grain size (μm) | Chemical composition (wt %) | | | |
|---|---|---|---|---|---|
| | | $Al_2O_3$ | $SiO_2$ | MgO | CaO |
| Example 2-1 | 1.2 | 96.0 | 2.5 | 1.0 | 0.4 |
| Example 2-2 | 8.9 | 96.1 | 2.2 | 1.3 | 0.3 |
| Example 2-3 | 0.9 | 99.8 | 0.05 | 0.1 | tr |
| Example 2-4 | 4.2 | 75.4 | 20.8 | 3.1 | 0.4 |

For conveniences' sake, the case of Example 2-1 in Tables 2 and 3 will be described below.

The same procedure as described in Example 1 was repeated, except that alumina powder having an average grain size and a chemical composition shown in Table 2 was used instead of sillimanite. The resulting sintered body had a density of 2.12 g/cm$^3$, and a linear shrinkage of 0.5±0.1% with respect to the green shaped body in any directions, whose dimensional accuracy was within a range of ±5 μm. The properties of the resulting sintered body and composite body are also shown in Table 3.

In the thus obtained electronic circuit substrate, the machinability in the formation of through-holes after the sintering is excellent, while the sintering shrinkage is small and the thermal expansion coefficient is small, which exhibit an excellent dimensional accuracy. Further, the electronic circuit substrate made from $Al_2O_3$ has a large thermal conductivity as shown in Table 3, so that heat emitted from the electronic circuits can be dissipated in a short time.

EXAMPLE 3

To 100 parts by weight of aluminum nitride powder having a purity of 97% by weight and an average grain size of 0.8 μm were added 2 parts by weight of wax, 1 part by weight of polyethylene glycol, 0.5 part by weight of stearic acid and 100 parts by weight of benzene, and then the resulting mixture was mixed in a ball mill for 5 hours and spray dried. In this case, the aluminum nitride powder contained 0.16% by weight of carbon, 0.1% by weight of silicon, 0.1% by weight of iron, 0.07% by weight of magnesium and 5.6% by weigth of yttrium oxide.

The dried mixture was weighed at a proper amount and molded in a metal die under a pressure of 1.0 t/cm² to obtain a green shaped body of 40 mm in diameter and 1 mm in thickness.

This green shaped body was placed in a graphite crucible and fired at a temperature of 1,600° C. in a nitrogen gas atmosphere under an atmospheric pressure for 1 hour. The thus obtained sintered body had a crystal structure of three-dimensional network, a density of 1.79 g/cm³ and an average bending strength of 8.8 kgf/mm².

Then, the sintered body was impregnated with the epoxy resin in the same manner as described in Example 1 to obtain a composite body.

The properties of the resulting composite body are shown in the following Table 3.

ball mill for 3 hours and shaped into a sheet of 1 mm in thickness through a doctor blade process, which was then dried in air for 24 hours to obtain a green sheet having a density of 2.0 g g/cm³.

The green sheet was fired at a temperature of 800° C. in the same manner as described in Example 1 to obtain a sintered body.

This sintered body had a density of 2.4 g/cm³ and a permeable porosity of 35 volume %.

Then, the sintered body was impregnated with the epoxy resin in the same manner as described in Example 1 to obtain a composite body having an average bending strength of 20 kgf/mm².

This composite body had a thermal expansion coefficient (0°–150° C.) of $5.2 \times 10^{-6}$/°C., a specific resistance of more than $10^{14}$ Ω.cm and a dielectric constant (1 MHz) of 9.6, which exhibited excellent properties as an electronic circuit substrate. Further, it has been confirmed that the drilling property is also excellent.

EXAMPLE 5

Onto one-side surface of the composite body obtained in Example 1 was piled a glass cloth impregnated with a B-stage epoxy resin, which was then hot pressed at a temperature of about 170° C. to obtain a laminate of the composite body and the epoxy resin impregnated glass cloth.

EXAMPLE 6

A mixture of chopped glass fibers having a diameter of about 3 μm and a length of about 1 mm and an epoxy resin was applied to one-side surface of the composite body obtained in Example 1, hardened to B-stage, and hot pressed at a temperature of about 170° C. to obtain a laminated body.

In the laminated bodies of Examples 5 and 6, the strength was considerably increased. The properties and machinability as an electronic circuit substrate were substantially equal to those of Example 2. That is, they were very excellent as the electronic circuit substrate.

EXAMPLE 7

An electronic circuit substrate 10 as shown in FIG. 1

TABLE 3

| | Sintered body | | | | Composite body | | | | | | |
|---|---|---|---|---|---|---|---|---|---|---|---|
| Example | Density (g/cm³) | Average grain size (μm) | Permeable porosity (vol. %) | Average bending strength (kgf/mm²) | Resin filling amount (vol. %) | Average bending strength (kgf/mm²) | Thermal expansion coefficient (°C.⁻¹) | Drill durability (number of drillings) | Thermal conductivity (cal/cm sec°C.) | Specific resistance (Ωm) | Relative dielectric constant |
| 1-1 | 2.00 | 4.9 | 37 | 1.5 | 94.1 | 5.1 | $4.0 \times 10^{-6}$ | >2,000 | 0.006 | >$10^{14}$ | 6.2 |
| 1-2 | 1.92 | 4.1 | 42 | 1.6 | 95.3 | 5.3 | $5.0 \times 10^{-6}$ | >2,000 | 0.006 | >$10^{14}$ | 6.1 |
| 1-3 | 1.79 | 3.3 | 40 | 5.1 | 93.3 | 8.2 | $4.0 \times 10^{-6}$ | >1,500 | 0.006 | >$10^{14}$ | 6.2 |
| 2-1 | 2.12 | 3.2 | 44 | 9.7 | 95.2 | 15.7 | $7.0 \times 10^{-6}$ | >1,000 | 0.03 | >$10^{14}$ | 6.0 |
| 2-2 | 2.11 | 12.4 | 45 | 8.1 | 96.0 | 14.2 | $7.1 \times 10^{-6}$ | >1,000 | 0.03 | >$10^{14}$ | 5.9 |
| 2-3 | 1.87 | 2.4 | 51 | 6.9 | 96.1 | 13.0 | $7.2 \times 10^{-6}$ | >1,000 | 0.03 | >$10^{14}$ | 6.0 |
| 2-4 | 2.00 | 6.7 | 40 | 8.0 | 93.8 | 12.3 | $7.0 \times 10^{-6}$ | >1,000 | 0.02 | >$10^{14}$ | 6.1 |
| 3 | 1.79 | 2.4 | 41 | 8.8 | 92.4 | 13.7 | $5.7 \times 10^{-6}$ | >1,000 | 0.08 | >$10^{14}$ | 8.1 |

EXAMPLE 4

To 100 parts by weight of glass ceramic powder having an average grain size of 2.1 μm and a chemical composition of 60% by weight of $Al_2O_3$, 5% by weight of $SiO_2$, 22% by weight of PbO and 13% by weight of $B_2O_3$ were added 12 parts by weight of polyacrylic acid ester, 1 part by weight of polyethylene glycol, 0.3 part by weight of a deflocculating agent and 70 parts by weight of water. The resulting mixture was mixed in a was manufactured as follows.

The same procedure as in Example 1-1 was repeated to form a ceramic composite body 11 as shown in FIG. 1. Then, a glass cloth impregnated with an epoxy resin was laminated on each surface of the composite body 11 and heat pressed at a temperature of about 170° C. to form a glass/epoxy layer 13 having a thickness of about 100 μm. In this case, the glass/epoxy layer 13 was strongly bonded to the respective surface of the composite body 11 because it was sufficiently joined with the resin filled in the permeable pores of the composite body 11. Thereafter, a copper foil was adhered to the exposed surface of each of the glass/epoxy layers 13, and unnecessary portions for the formation of conductor circuits 12 were etched out. After a through-hole 14 having a diameter of 0.8 mm was formed in the assembled composite body by means of a super-hard drill (WC-Co), an electroless copper plating was applied to the through-hole to form the electronic circuit substrate 10.

EXAMPLE 8

An electronic circuit substrate 10 as shown in FIG. 2 was manufactured as follows.

After a copper foil was adhered to each surface of a ceramic composite body 11 in Example 1-1, unnecessary portions for the formation of conductor circuits 12 were etched out, and a glass cloth impregnated with an epoxy resin was laminated thereon and heat pressed at a temperature of about 170° C. to form a glass/epoxy layer 13 having a thickness of about 100 μm. In this case, the glass/epoxy layer 13 was sufficiently joined with the resin filled in the permeable pores of the composite body 11 at portions other than the conductor circuits 12.

Then, a copper foil was further adhered to the exposed surface of the glass/epoxy layer 13, and unnecessary portions for the formation of another conductor circuits 12 were etched out. After a through-holes 14 having a diameter of 0.8 mm was formed in the assembled composite body by means of a super-hard drill, an electroless copper plating was applied to the through-hole to form the electronic circuit substrate 10.

EXAMPLE 9

An electronic circuit substrate 10 as shown in FIG. 3 was manufactured as follows.

After conductor circuits 12 were formed by the same manner as in Example 7, a glass cloth impregnated with an epoxy resin was laminated on one of the glass/epoxy layers and heat pressed to form another glass/epoxy layer 13. Then, a through-hole 14 was formed in the assembled composite body 11 by means of a super-hard drill and subjected to an electroless copper plating to form the electronic circuit substrate 10 having multi-layer conductor circuits.

EXAMPLE 10

An electronic circuit substrate 10 as shown in FIG. 4 was manufactured as follows.

After a ceramic composite body 11 of Example 1-1 was laminated at both surfaces with copper foils, a through-hole 14 was formed by means of a super-hard drill. Then, unnecessary portions for the formation of conductor circuits 12 were etched out, and an electroless copper plating was applied to the through-holes.

After two composite bodies 11 as treated above were joined with each other through an adhesive layer 15, a through-hole 4 was further formed in the assembly of the composite bodies by means of a super-hard drill and again subjected to an electroless copper plating to form the electronic circuit substrate 10 having multi-layer conductor circuits.

As mentioned above, the electronic circuit substrate made of the ceramic composite body according to the invention is characterized by filling a resin in permeable pores of the porous ceramic sintered body having a crystal structure of three-dimensional network, so that it is suitable for weight reduction and high integration and also the machinability and dimensional accuracy are excellent. That is, the invention can provide electronic circuit substrate totally solving the problems of the prior art as previously mentioned.

Further, various properties required in this type of the electronic circuit substrate can be provided by properly selecting the material for the substrate and its crystal structure. That is, when the crystal structure of the ceramic sintered body is composed of at least one of sillimanite, andalusite, kyanite, cordierite and mullite, it has a thermal expansion coefficient approximately equal to that of, for example, a silicon integrated circuits, so that it is possible to directly mount the silicon integrated circuit onto the substrate. When the material mainly contains at least one of alumina, aluminum nitride, boron nitride and compounds thereof, the strength and thermal conductivity are excellent and also heat generated from the integrated circuit can be dissipated satisfactorily. Moreover, when steatite, forsterite, cordierite, alumina or the like is used as the material, the electronic circuit substrate having a small dielectric constant can be obtained.

According to the invention, since the ceramic composite body is fairly excellent in the thermal conductivity, even if heat is generated by a load of a printed resistor formed in the conductor circuit, it is easily dissipated. Therefore, a printed resistor bearing a fairly high load can be applied to the electronic circuit substrate.

What is claimed is:

1. An electronic circuit, comprising:
   a porous ceramic sintered substrate consisting essentially of a crystal structure of a three-dimensional network, crystal grains having an average grain size of not greater than 10 microns, and an initial permeable porosity of 10–70 volume %;
   a resin filled in the permeable pores of the porous ceramic sintered substrate; and
   an electrically conducting circuit pattern printed on at least one surface of said substrate.

2. An electronic circuit according to claim 1, wherein said porous ceramic sintered substrate mainly comprises at least one material selected from the group consisting of $Al_2O_3$, $SiO_2$, ZnO, $ZrO_2$, MgO, PbO, $B_2O_3$, $Si_3N_4$, BN, AlN and combinations thereof.

3. An electronic circuit according to claim 1, wherein said porous ceramic sintered substrate, after said permeable pores are filled with said resin, has a porosity of not greater than 10 volume %.

4. An electronic circuit according to claim 1, wherein said porosity is not greater than 5 volume %.

5. An electronic circuit according to claim 1, wherein said resin is selected from the group consisting of epoxy resin, polyimide resin, triazine resin, polyparabonic acid resin, polyamide imide resin, silicone resin, epoxy silicone resin, acrylic resin, methacrylic resin, aniline resin, phenolic resin, urethane resin, furan resin, fluorine resin and mixtures thereof.

6. An electronic circuit according to claim 1, wherein said porous ceramic sintered substrate further comprises a mixture of resin and inorganic fibers applied to at least one surface of said substrate.

7. An electronic circuit comprising:
   a porous ceramic sintered substrate comprising a material selected from the group consisting of $Al_2O_3$, $SiO_2$, ZnO, $ZrO_2$, MgO, PbO, $B_2O_3$, $Si_3N_4$, BN, AlN and combinations thereof, said porous ceramic sintered substrate consisting essentially of a crystal structure of a three-dimensional network, crystal grains having an average grain size of not greater than 10 microns and a permeable porosity of 10-70 volume %;

a resin comprising a material selected from the group consisting of epoxy resin, polyimide resin, triazine resin, polyparabonic acid resin, polyamide imide resin, silicone resin, epoxy silicone resin, acrylic resin, methacrylic resin, aniline resin, phenolic resin, urethane resin, furan resin, fluorine resin and mixtures thereof, said resin being filled into the pores of the porous ceramic sintered substrate, thereby enhancing the machinability of the substrate and rendering said substrate substantially air impermeable after sintering; and an electrically conducting circuit pattern printed on at least one surface of said substrate.

8. An electronic circuit according to claim 7, wherein said substrate, after said permeable pores are filled with said resin, has a porosity of not greater than 10 volume %.

9. An electronic circuit according to claim 7, wherein said substrate, after said permeable pores are filled with said resin, has a porosity of not greater than 5 volume %.

10. An electronic circuit according to claim 7, wherein said porous ceramic sintered substrate further comprises a mixture of resin and inorganic fibers applied to at least one surface of said substrate.

11. An electronic circuit, comprising:

a porous ceramic sintered substrate consisting essentially of a crystal structure of a three-dimensional network, crystal grains having an average grain size of not greater than 10 microns, and an initial permeable porosity of 10-70 volume %;

a resin filled in the permeable pores of the porous ceramic sintered substrate;

an inorganic fiber cloth impregnated with a resin, said cloth being integrally bonded to at least one surface of said substrate; and an electrically conducting circuit pattern printed on at least one surface of said substrate.

12. An electronic circuit according to claim 11, wherein said porous ceramic sintered substrate mainly comprises at least one material selected from the group consisting of $Al_2O_3$, $SiO_2$, ZnO, $ZrO_2$, MgO, PbO, $B_2O_3$, $Si_3N_4$, BN, AlN and combinations thereof.

13. An electronic circuit according to claim 11, wherein said porous ceramic sintered substrate, after said permeable pores are filled with said resin, has a porosity of not greater than 10 volume %.

14. An electronic circuit according to claim 11, wherein said porosity is not greater than 5 volume %.

15. An electronic circuit according to claim 11, wherein said resin is selected from the group consisting of epoxy resin, polyimide resin, triazine resin, polyparabonic acid resin, polyamide imide resin, silicone resin, epoxy silicone resin, acrylic resin, methacrylic resin, aniline resin, phenolic resin, urethane resin, furan resin, fluorine resin and mixtures thereof.

* * * * *